(12) United States Patent
Wallace, Jr. et al.

(10) Patent No.: US 6,217,649 B1
(45) Date of Patent: Apr. 17, 2001

(54) CONTINUOUS MELT REPLENISHMENT FOR CRYSTAL GROWTH

(75) Inventors: Richard L. Wallace, Jr., Acton; Emanuel M. Sachs, Newton; Jennifer Martz, Randolph, all of MA (US)

(73) Assignee: Evergreen Solar, Inc., Waltham, MA (US)

( * ) Notice: Subject to any disclaimer, the term of this patent is extended or adjusted under 35 U.S.C. 154(b) by 0 days.

(21) Appl. No.: 09/483,045

(22) Filed: Jan. 13, 2000

Related U.S. Application Data

(62) Division of application No. 09/304,284, filed on May 3, 1999, now Pat. No. 6,090,199.

(51) Int. Cl.[7] .................................................. C30B 15/20
(52) U.S. Cl. ........................... 117/47; 117/87; 117/211; 117/212; 117/922
(58) Field of Search .................................. 117/16, 26, 27, 117/47, 87, 211, 212, 903, 922

(56) References Cited

U.S. PATENT DOCUMENTS

| | | |
|---|---|---|
| 4,036,595 | 7/1977 | Lorenzini et al. . |
| 4,469,552 | 9/1984 | Thornhill . |
| 4,594,229 | 6/1986 | Ciszek et al. . |
| 4,627,887 | 12/1986 | Sachs . |
| 4,661,200 | 4/1987 | Sachs . |
| 4,689,109 | 8/1987 | Sachs . |
| 4,936,947 | 6/1990 | Mackintosh . |
| 5,098,229 | 3/1992 | Meier et al. . |
| 5,242,667 | 9/1993 | Koziol et al. . |

FOREIGN PATENT DOCUMENTS

| | | |
|---|---|---|
| 0 170 856 | 2/1986 | (EP) . |
| 53-073481 | 6/1978 | (JP) . |
| 59-182293 | 10/1984 | (JP) . |

*Primary Examiner*—Felisa Hiteshew
(74) *Attorney, Agent, or Firm*—Testa, Hurwitz & Thibeault, LLP

(57) ABSTRACT

The invention features a method of continuous crystalline growth. A granular source material is introduced into a hopper. A volume of the granular source material exiting the hopper is disposed on a translationally moving belt. The volume of the granular source material forms an angle of repose with the moving belt. The granular source material disposed on the moving belt is continuously fed into a crucible comprising a melt of the granular source material at a rate based on the angle of repose, the speed of the belt, and the size of the opening of the hopper. A crystalline ribbon is continuously grown by solidifying the melt.

18 Claims, 7 Drawing Sheets

α ≡ Angle of Repose
H ≡ Height
L ≡ Horizontal Width at Bottom of Funnel

Cross Sectional Mass Area

= 1/2(H/tanα)H + 1/2(H/tanα)H + LH
= $H^2$/tanα + LH $Tan\ \alpha = H1/\{(L2-L1)/2\}$ $H1 = (tan\ \alpha)(L2-L1)/2$ $Area\ of\ Feedstock\ pile = (L2*H2)-\{(tan\ \alpha)(L2-L1)^2\}$ ated application of U.S. patent application
CONTINUOUS MELT REPLENISHMENT FOR CRYSTAL GROWTH

RELATED APPLICATIONS

This is a divisional application of U.S. patent application Ser. No. 09/304,284 filed on May 3, 1999 now U.S. Pat. No. 6,090,199.

FIELD OF THE INVENTION

The invention relates generally to crystal growth of semiconductor materials, and more specifically to a method of continuous crystal growth.

BACKGROUND

In order to produce lower cost solar cells to facilitate large scale electrical applications of solar electricity, it is important to provide lower cost substrate materials for making the solar cells. A known method for achieving this objective is to grow crystalline silicon using a continuous ribbon growth process as described in U.S. Pat. Nos. 4,661,200; 4,627,887; 4,689,109; and 4,594,229.

According to the continuous ribbon growth method, two high temperature material strings are introduced through holes in a crucible which contains a shallow layer of molten silicon. A crystalline silicon ribbon forms as the melt solidifies while being pulled vertically from the melt. The strings stabilize the edges of the growing ribbon. The molten silicon freezes into a solid ribbon just above the layer of molten silicon. To make this ribbon silicon process continuous, silicon is added to the melt as the crystalline silicon is formed to keep the amount of melt constant. Keeping the amount of the melt constant during the growth process is also important in order to achieve uniform and controllable growth of the crystalline silicon, and to keep the thermal environment of the cooling ribbon constant. Slight changes in the depth of the melt and consequent changes in the vertical position of the solid-liquid interface can significantly change this thermal environment. For example, it has been found that variations in the melt depth of more than about one millimeter can result in a markedly different thickness and introduce a residual stress state of the grown silicon ribbon. For all of these reasons, a constant melt level is an important element in insuring uniform, controlled growth of silicon ribbon. A method for continuously measuring the melt depth to provide feedback to a feed mechanism can be accomplished as described in the co-pending patent application titled, "Melt Depth Control for Semiconductor Materials Grown from a Melt," which is incorporated herein by reference. Once such a method is established, it then becomes important to be able to introduce a feed material at an accurate and predetermined rate. Since the solid silicon feed material must be melted, it is important that the introduction of solid silicon into the melt takes place with a minimum of thermal disruption in the immediate environment of the solid-liquid interface.

Controllable metering of feed material also has general application to crystal growth, where thermal upsets are not desirable, and a constant feed rate is needed. One example is in Czochralski growth of Si ingots, where it is desired to introduce additional feed material to the crucible during the growth. In this manner, a longer ingot of Si can be pulled from a single seeding.

Several methods of introducing a feed material into a crucible containing molten silicon are known U.S. Pat. No. 4,036,595 describes a method wherein a separately heated crucible is used. European Patent No. 0 170 856 B1 describes a feeder with a moving belt which can be used for adding the feed silicon to a rotating cylindrical crucible with concentric dams to collect and melt the feed silicon in Czochralski crystal growth. U.S. Pat. No. 5,242,667 teaches a method which uses a silicon wiper blade on a horizontal, silicon rotating disc to control the feed rate from a storage hopper above the disc. All of these methods, however, have disadvantages. The first method requires a separately heated crucible. The second method requires a complex crucible arrangement that is only suitable for a cylindrical geometry, and may be difficult to implement for a feed material with a low angle of repose. The third method has limitations in controlling the feed rate for small feed rates such as would be found in silicon ribbon growth.

In order to controllably and continuously transport a silicon feed material for continuous silicon ribbon growth, it is important that the material have a morphology which lends itself to being readily and controllably transported. Silicon itself, if crushed, exhibits angular fracture and breakage along cleavage planes. This renders crushed silicon to be highly irregular in shape and thus difficult to controllably transport using a known method such as a vibratory feeder. Spherical silicon, on the other hand, can be produced by the fluidized bed decomposition of silane ($SiH_4$) or in a shot tower. The former is a widely used method and presently is the source material for most silicon ribbon growth. This method produces spherical silicon with a size distribution from almost fine dust to about 2 mm in diameter.

U.S. Pat. No. 5,098,229 describes a silicon melt replenishment system which uses a pressurized fluid to blow silicon spheres up into a melt. One major disadvantage of this system is that it requires spherical silicon. Another major disadvantage is that the silicon spheres need to be in a fairly narrow particle size range to be effective. Spherical particles either too small or too large cannot be effectively used with this system. The result is that it is necessary to sieve the fluidized bed material to eliminate too large and too fine silicon spheres. The additional labor and handling of the sieving operation add to cost and increase the risk of impurity contamination.

Silicon ribbon grown for solar cell purposes is usually doped with a small amount of a dopant, typically Boron. Very small silicon pellets can be doped with Boron. Alternatively, very small amounts of Boron pellets can be added to the feed material consisting of silicon pellets and physically mixed with the silicon pellets before being transported into the molten silicon prior to growth. The mixing is done to promote a uniform distribution of Boron. However, in some transport systems such as a vibratory feeder, inhomogeneous mixing of Boron pellets or Boron containing silicon pellets can result. This can produce variations in the final bulk resistivity of the grown ribbon and this in turn can result in a less tightly controlled manufacturing process for solar cells.

A melt replenishment method that allows for continuous growth, which utilizes all sizes and morphologies of silicon, which allows for a simplified, low cost crucible design for silicon ribbon growth, and which produces a more homogeneous mixing of Boron, is thus very much needed and would represent a significant step towards low cost photovoltaics.

SUMMARY OF THE INVENTION

The invention features a method of continuous crystalline growth. In one aspect, the invention features a method of continuous crystalline ribbon growth. A granular source material is introduced into a feeder. In one embodiment, the feeder is a hopper. A volume of the granular source material exiting the hopper is disposed on a translationally moving belt. The volume of the granular source material forms an angle of repose with the moving belt. The granular source material disposed on the moving belt is continuously fed into a crucible comprising a melt of the granular source material at a rate based on the angle of repose, the belt speed, and the hopper opening size. A crystalline ribbon is continuously grown by solidifying the melt at the solid liquid interface.

In one embodiment, a semiconductor is the granular source material and a crystalline semiconductor is grown in a continuous ribbon. The semiconductor source material can be doped n or p type and is fed from the hopper onto the moving belt which then feeds into the crucible.

In another preferred embodiment, silicon is the granular source material. The silicon source material can be doped either n or p type. The silicon granular source material is introduced into a hopper and the material exits the hopper onto a moving belt. The belt speed varies from about 2 mm/min to 10 mm/min. The material exits the moving belt and is fed into a growth crucible. The rate of feeding the source material into the growth crucible can be based on the angle of repose, the speed of the moving belt, and the hopper opening size just above the belt.

In another aspect, the invention features a method of introducing a source material into a melt for use in a continuous crystalline growth. A granular source material is introduced into a hopper. A volume of the granular source material exiting the hopper is disposed on a translationally moving belt. The belt has at least one raised lip. In one detailed embodiment, the raised lip is disposed near an edge of the belt. The volume of the granular source material forms an angle of repose with the moving belt. The granular source material disposed on the moving belt is continuously fed in a crucible comprising a melt of the granular source material at a rate based on the angle of repose.

The invention also features a system for continuous ribbon crystal growth. The system includes a hopper for providing a granular source material in a pile forming an angle of repose with a substantially planar surface, a crucible for holding the melt of the granular source material, a pair of strings disposed through the crucible for stabilizing crystalline ribbon growth from the melt and a translationally moving belt. The belt continuously delivers the granular source material from the feeder to the crucible at a rate based on the angle of repose, the belt speed, and the hopper opening just above the belt. In one embodiment, the belt comprises at least one raised lip. In another embodiment, the belt comprises a pair of lips, and further comprises a stopper disposed above the belt, behind the hopper.

In another embodiment, the feeder comprises a hopper and the granular source material comprises a semiconductor material, wherein the granular source material can also have non-uniform sized and shaped particles.

In another aspect, the invention features a system for introducing a source material into a melt for use in a crystalline growth system. The system comprises a feeder for providing a granular source material in a pile formning an angle of repose with a substantially planar surface, a crucible for holding a melt of the granular source material, and a translationally moving belt for continuously delivering the granular source material from the feeder to the crucible at a rate based on the angle of repose. The belt comprises at least one raised lip.

DETAILED DESCRIPTION

All granular materials have a characteristic angle, termed the angle of repose, which refers to the angle with a horizontal plane on which a free standing pile of the granular material would form if allowed to slowly fall from a narrow orifice onto the plane. Such an angle is a basic property of a material having a given particle size distribution and a given particle shape distribution.

Figure 1:
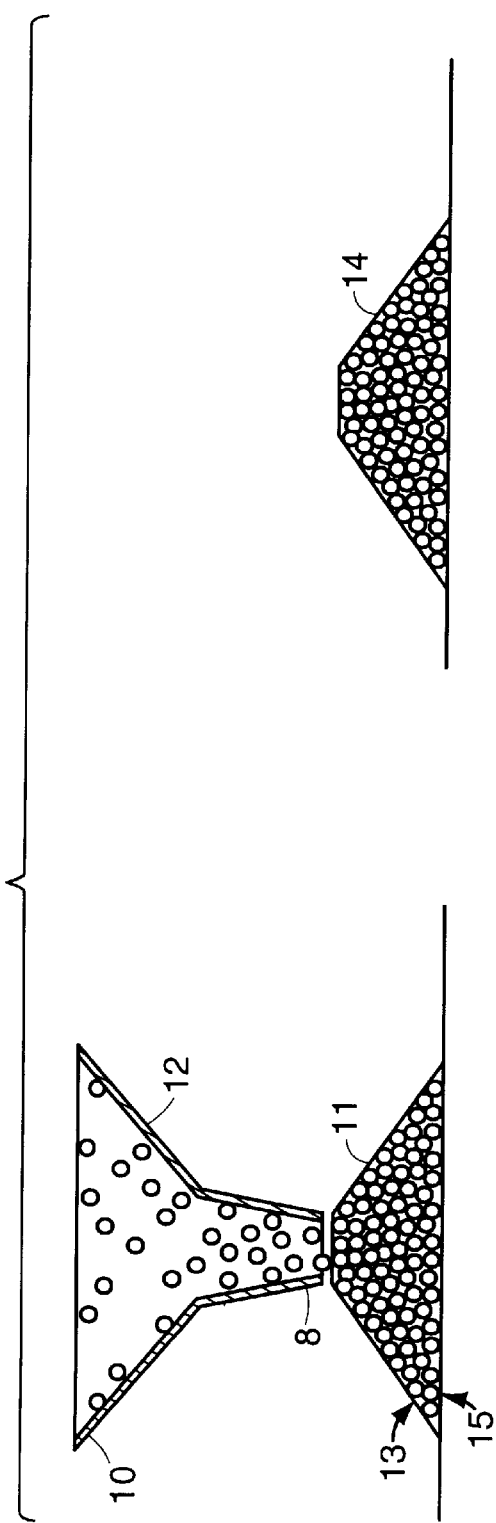
FIG. 1 illustrates an angle of repose of a granular material.

Referring to FIG. 1, a pile of granular material 11 exiting a hopper 12 or a large funnel shaped feeder forms a specific angle of repose 13 with a flat surface 15. For a particular particle size and morphology distribution, a constant cross section or a constant mass of material 14 is repeated as illustrated in FIG. 1, and shown in detail further in FIG. 6.

Figure 2C:
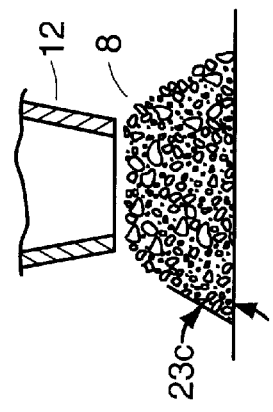
FIGS. 2(a)–2(c) illustrate variations in the angle of repose for spherical particles with a narrow size distribution, spherical particles with a wide size distribution, and crushed silicon particles having an angular shape.
Figure 2B:
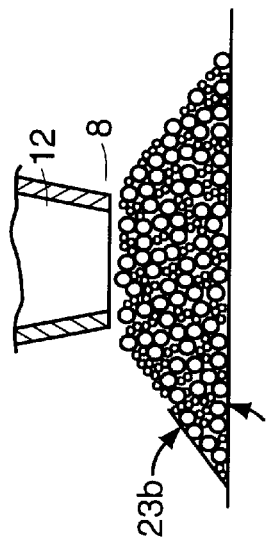
Figure 2A:
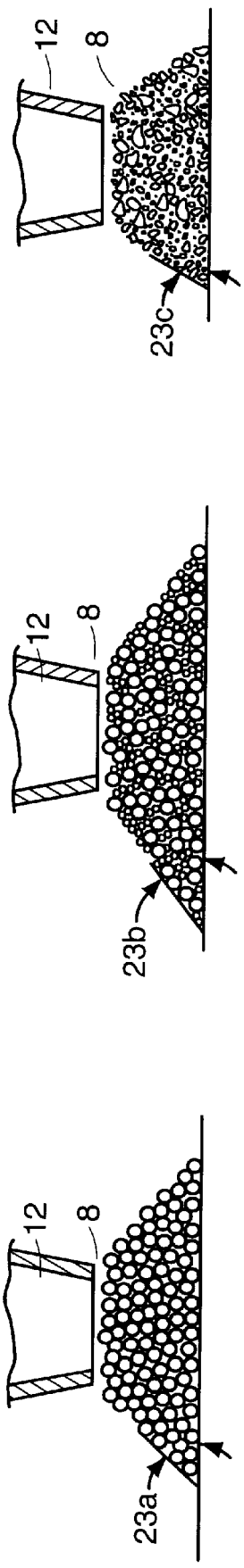

Referring to FIGS. 2(a) to 2(c), the angle of repose 23a, 23b and 23c varies for different particle size and morphology distribution. FIG. 2(a) shows the angle of repose for particles that are spherical and having a narrow size distribution. FIG. 2(b) shows the angle of repose for particles that are spherical and having a wide size distribution. The angle of repose for the particles with a wide size distribution is different than the angle of repose for the particles with a small size distribution. FIG. 2(c) shows the angle of repose for non-spherical shaped particles. The particles are angular shaped. The angle of repose of non-spherical particles is larger than the angle of repose of spherical particles.

The present invention uses the concept of the angle of repose formed on a slowly moving belt to provide continuous, uniform melt replenishment for the growth of silicon ribbon. A granular source material forming on a translationally moving belt forms an angle of repose with the moving belt and a constant cross section as described above.

The rate of introducing the source material into a crucible containing a melt can be controlled by adjusting the belt speed, the angle of repose, and the size of the hopper opening just above the belt.

Figure 4:
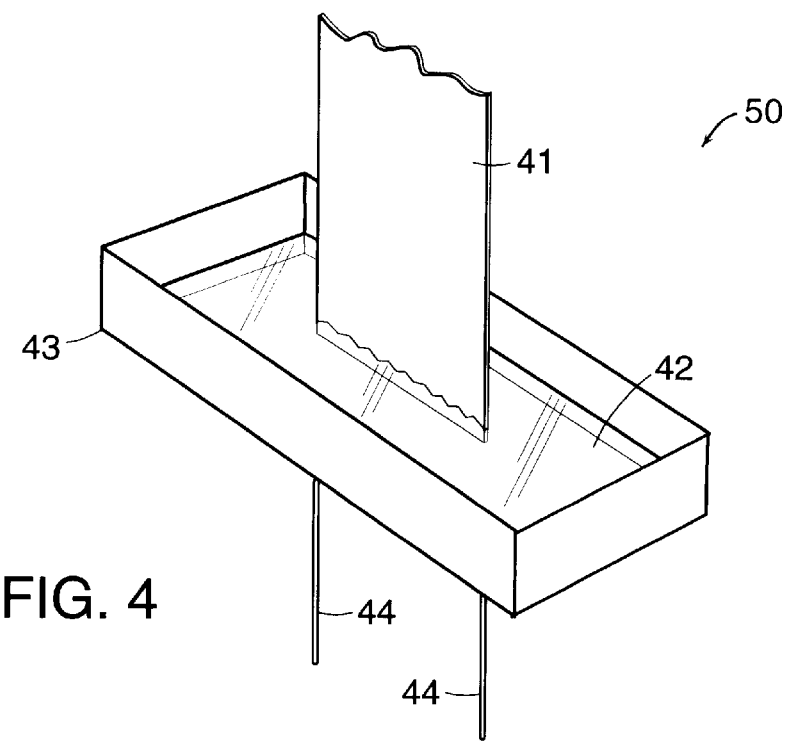
FIG. 4 illustrates a system for continuous ribbon crystal growth.

Referring to FIG. 4, a continuous ribbon growth system 50 includes a crucible 43 containing a pool of molten silicon ("the melt") 42 and a pair of strings 44 extending through the crucible 43. A thin polycrystalline sheet of silicon 41 is slowly drawn from the melt 42, as the cooler liquid silicon crystallizes at the top of meniscus. The strings 44 passing through holes (not shown) in the bottom of the crucible 43 become incorporated in and define the edge boundaries of the crystalline sheet 41. The strings 44 stabilize the edges as the sheet 41 grows. The surface tension of the silicon prevents leaks through the holes of the crucible 43 where the strings 44 pass through. In an actual continuous-crystal-growth apparatus, the melt 42 and the crucible 43 are housed within an inert-gas filled housing (not shown) to prevent oxidation of the molten silicon. Rollers (not shown) keep the sheet 41 moving vertically as the sheet 41 grows. The crucible 43 remains heated to keep the silicon molten in the melt 42. The crucible 43 also remains stationary.

Figure 3:
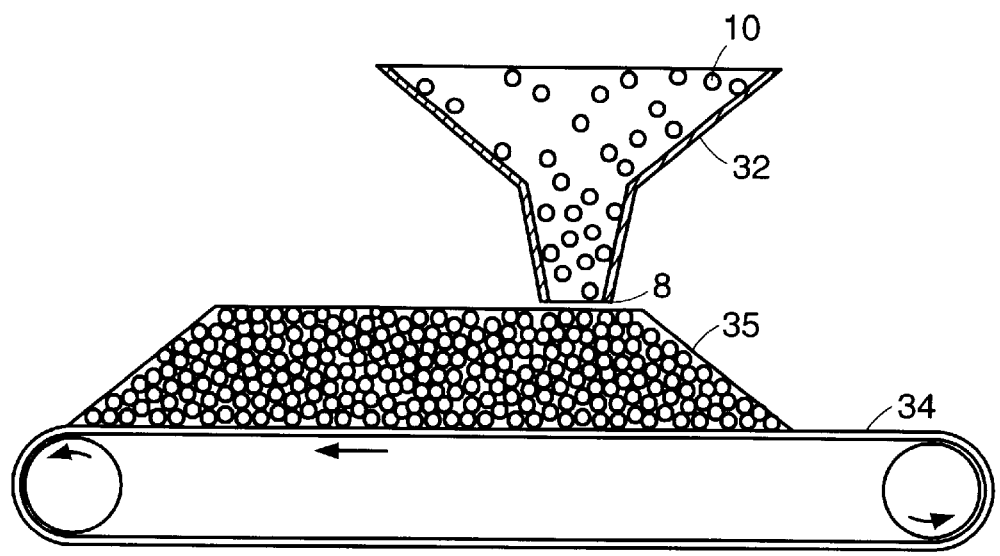
FIG. 3 shows an embodiment of a portion of a continuous crystal growth system according to the present invention.

To provide a continuous crystal growth process, the melt 42 needs to be continuously replenished as some of the melt 42 is lost by solidifying to form a crystalline ribbon. In one embodiment, a granular source material 35 enters a hopper 32 through a large opening 10 and exits the hopper 32 through a small opening 8, as shown in FIG. 3. The granular source material 35 can have non-uniform sized particles. The source material, for example, can be a semiconductor material. In one embodiment, the source material comprises silicon and a dopant such as boron. The source material 35 exiting the hopper 32 disposes a pile of the source material 35 on a translationally moving belt 34. The pile of the source material 35 has an angle of repose, which is determined by the shape and size distributions of the particles forming the source material 35.

Figure 5:
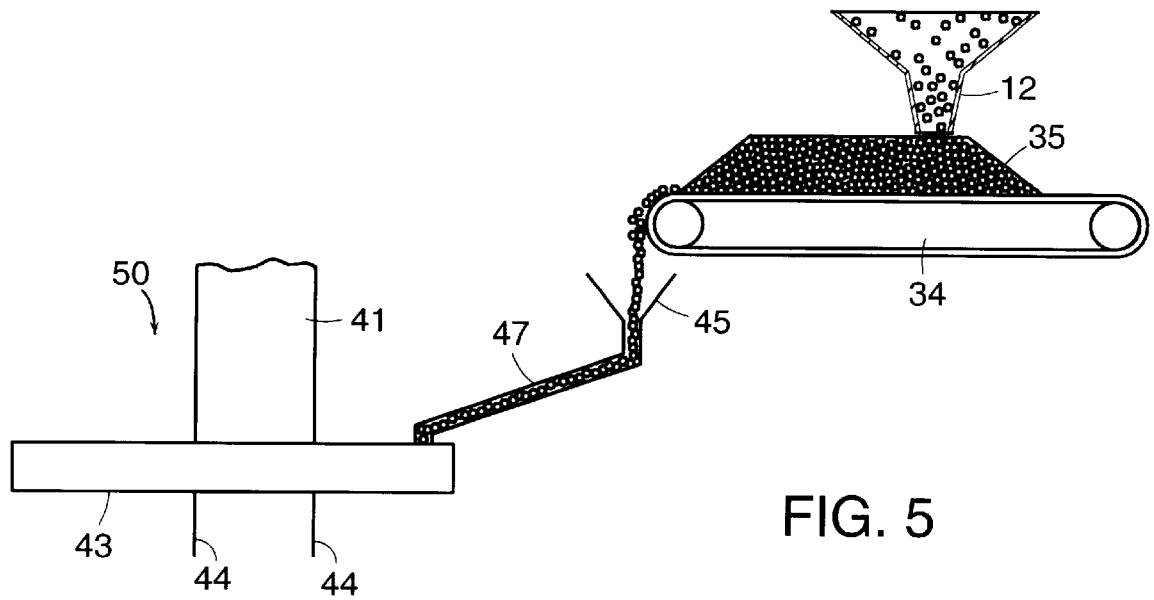
FIG. 5 shows an embodiment of a continuous ribbon crystal growth system according to the present invention.

Referring to FIG. 5, the source material 35 disposed on the moving belt 34 is continuously fed into a crucible 43 comprising a melt of the source material 35 at a predetermined rate. The source material is introduced into the crucible through a funnel 45 and a tube 47. The tube 47 is positioned inside one end of the crucible 35. In one embodiment, the feed rate is constant. The feed rate is based on the angle of repose of the source material.

Figure 6:
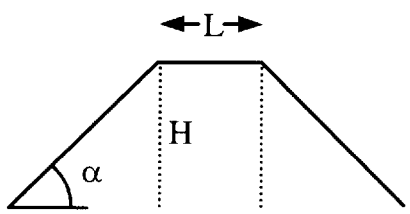
FIG. 6 illustrates calculation of the cross sectional mass area of a pile of granular material on a horizontal plane.

The volume of the source material is equal to the product of the mass cross sectional area of the source material times the speed of the moving belt. FIG. 6 illustrates the mass cross sectional area. The mass cross sectional area is equal to $H^2/\tan\alpha + HL$, where $\alpha$ is the angle of repose, H is the height, and L is the size of the hopper opening just above the belt. The feed rate can be controlled by the rate of movement of the belt in combination with the angle of repose. The belt, for example, can move at a constant rate and thereby introduce the source material into the crucible at a constant rate. The belt can also move at a rate in the range from 2 mm/min to 10 mm/min. In still another embodiment, the feed rate is based on the cross sectional area of the source material as it resides on the belt, or on the belt speed.

The use of the angle of repose concept along with a slowly moving belt, as shown in FIGS. 3, 5 and 6, enables one to transport continuously and very accurately, any desired amount of granular silicon into a crucible containing the melt. As is evident from FIG. 1, the cross-section of material emerging from the narrow orifice is constant due to the constancy of the characteristic angle of repose. With this constant cross-section, the amount of material transported can be varied simply by varying the speed of the belt carrying the granular material. Thus, the invention allows a considerable amount of latitude in choosing the particle size distribution and the particle shape distribution for the silicon feeder material.

Figure 7:
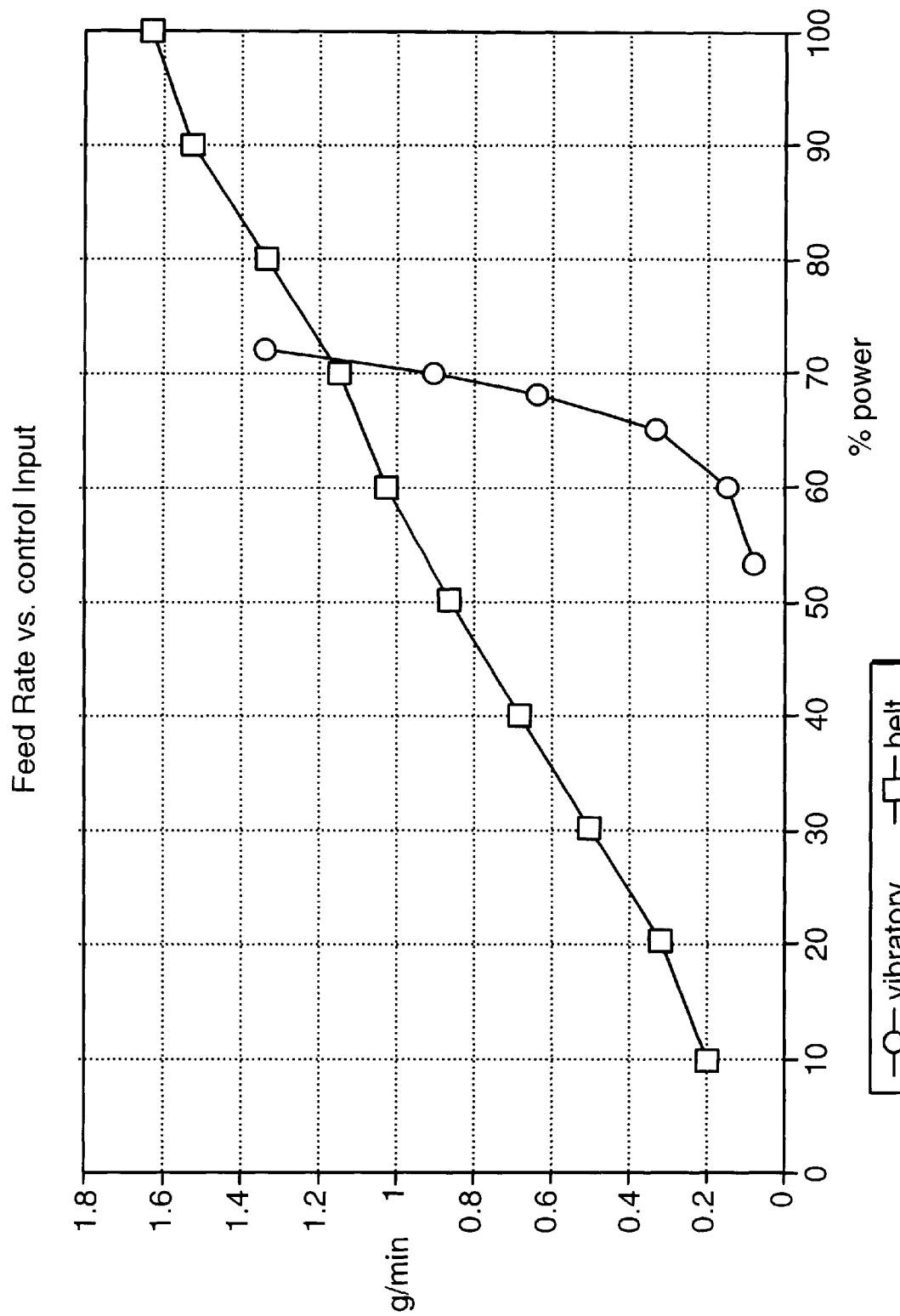
FIG. 7 is a graph illustrating the linear relationship between the feed rate and the belt speed (or % power) for the continuous ribbon crystal growth system of the invention, and the highly non-linear relationship between the feed rate and the belt speed (or % power) for a vibratory feeding system.
Figure 8:
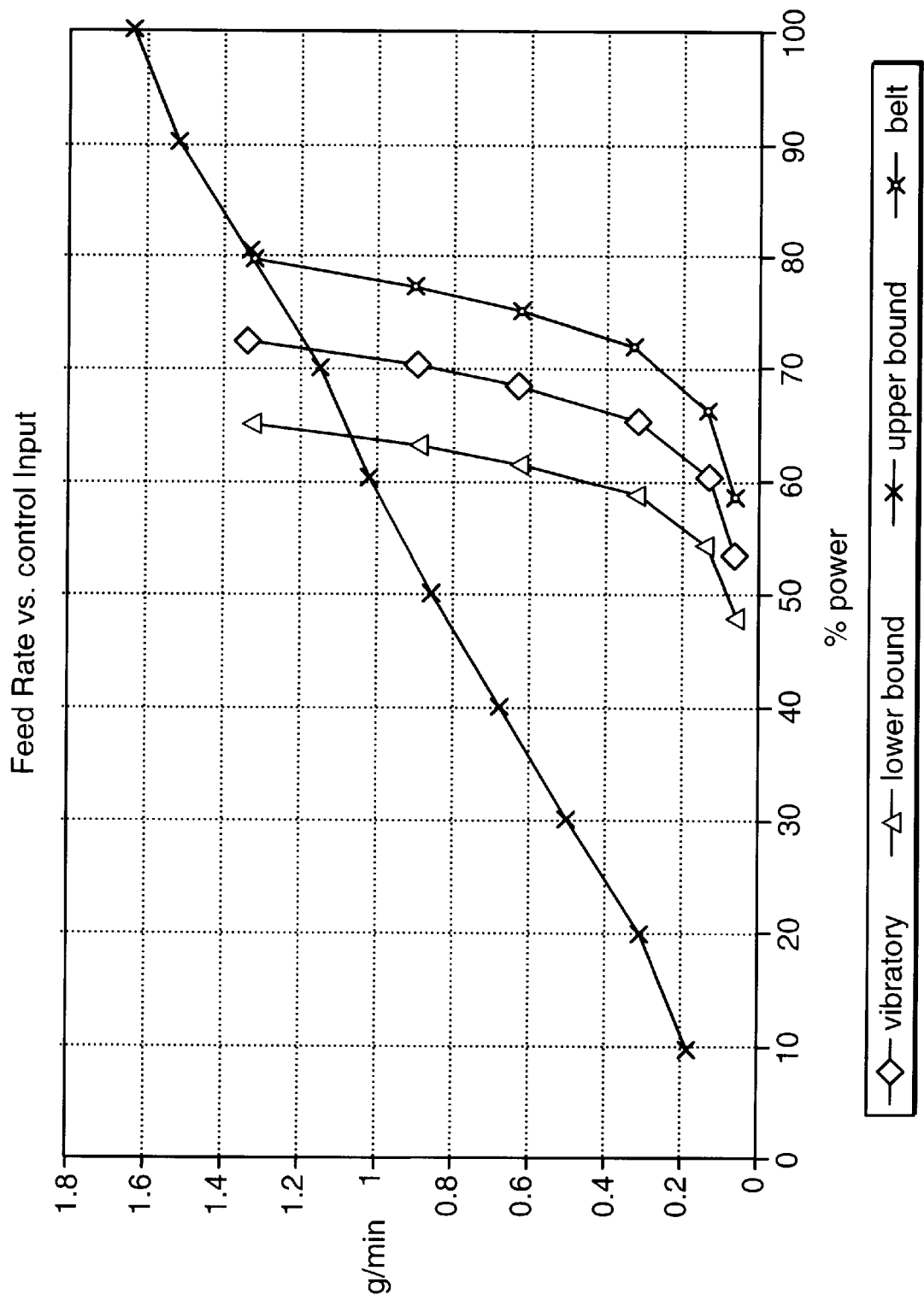
FIG. 8 shows the degree of variation which a vibratory feeder can introduce when compared to the present invention.

A very simple, linear relationship exists between the belt speed and the feed rate. FIG. 7 illustrates that the rate of introducing the source material 35 into the crucible 43 is directly proportional to the speed at which the belt 34 moves or the amount of power applied to the belt 34 to move the belt 34. As shown in FIG. 8, the relationship between the applied power or belt speed and the feed rate in the present invention is also consistent, so that the feed rate resulting from a particular belt speed can be repeated. In contrast, the relationship between the power applied and the feed rate in a vibratory system is non-linear and complex, in addition to being inconsistent. The same amount of power applied to the vibratory system can result in varying feed rates in a vibratory system as shown in FIG. 8.

Figure 9A:
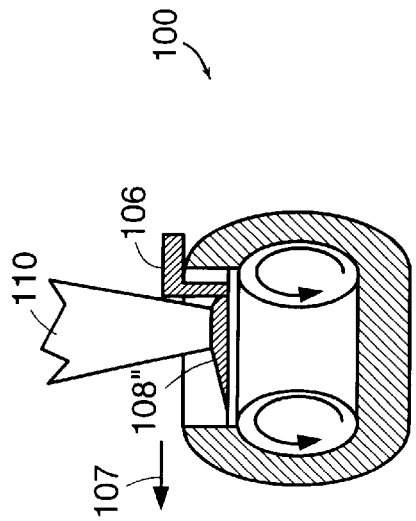
FIGS. 9a and 9b illustrate one embodiment of part of a continuous crystal growth system according to the present invention.
Figure 9B:
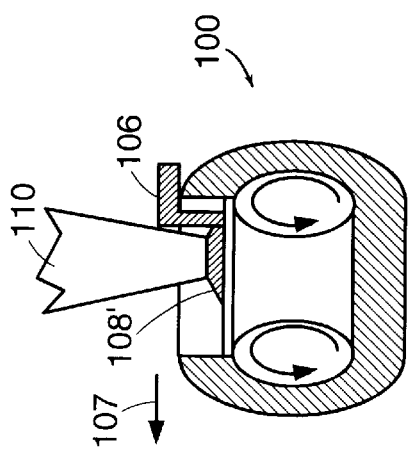

In one embodiment, the location of the hopper exit is no less than 1 inch from the (feeding) end of the belt. That is, the belt with the feedstock deposited on it should travel at least 1 inch before the feedstock drops off. This is to allow the pile of feedstock to extend to its limits (as governed by angle-of-repose) in the direction of belt travel, while the belt is not moving. Without this buffer distance, there is the risk of feedstock spilling over the end of the belt even without belt motion—compromising the entire metering scheme. This concept is illustrated in FIGS. 9a–9b, where FIG. 9a shows a feedstock material 108' having an angle of repose twice that of the feedstock material 108" shown in FIG. 9b.

In another embodiment, small pulleys are used to move the belt. This embodiment ensures a well-defined point at which the feedstock slides off the belt. In one embodiment, the belt makes close to a 90° bend to define the line where the feedstock drops into the funnel.

In another embodiment, the spacing between the belt and the hopper exit is about the maximum diameter of the feedstock particles. This serves to limit the amount of feedstock on the belt, and allows the largest particles to pass between the belt and the hopper exit.

In still another embodiment, the belt is flexible. The flexible belt allows for simple tensioning to define the resting belt position, while allowing belt compliance if a feedstock particle with a large diameter is encountered. This compliance of the belt is useful for feedstock with a poorly defined particle size.

In still another embodiment, the belt is made of a material that does not contaminate the silicon feedstock with transition metals such as Titanium or Vanadium. The belt material can also be abrasion resistant, so that the belt material does not contaminate the melt.

Figures 1, 10B:
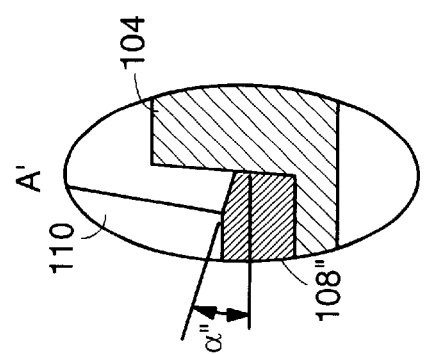
FIGS. 10a and 10b show cross sectional views of part of the crystal growth system of FIGS. 9a and 9b, respectively.
Figure 10B:
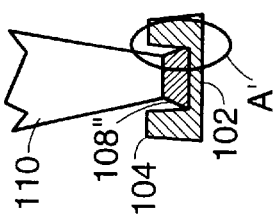
Figures 1, 10A:
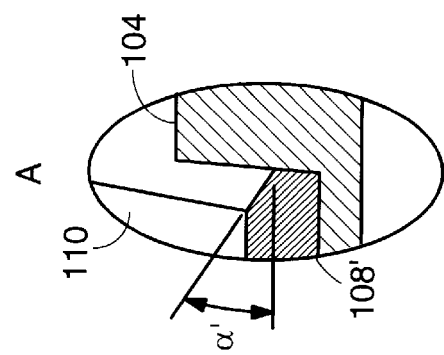
Figure 10A:
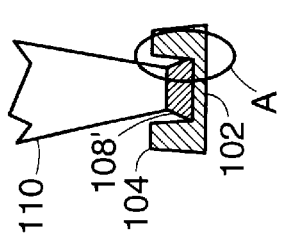

Referring to FIGS. 9a–9b and 10a–10b, a continuous crystal growth system 100 includes a belt 102 having raised lips 104 at the sides and a stopper 106. The stopper 106 is positioned behind the hopper 108 in the direction away from the belt motion 107. This embodiment is particularly useful when feeding a material having a low angle of repose or a poorly defined angle of repose. The raised lips 104 and the stopper 106 constrain the extent of the pile of feedstock 108', 108" that forms below the hopper 110. The raised lips 104 and the stopper 106 provide several advantages. They limit the amount of the feedstock 108', 108" material present on the belt 102, providing controlled feeding of a small mass flow of the feedstock 108', 108" material into the crucible (not shown). They also limit the size of the belt apparatus, and confine the flow of the feedstock 108', 108" on the belt 102 in only the direction of belt motion 107. The feedstock 108', 108" material is prevented from falling off the sides of the belt 102 or behind the belt 102. FIG. 10a shows a feedstock 108' having an angle of repose of α' placed on a moving belt 102 having raised lips 104 and a stopper 106. Alternatively, other embodiments can be used to restrict the size of the pile of the feedstock material. For example, a groove or a channel can be created on the belt.

FIG. 10b shows a feedstock 108" having an angle of repose of α", which is about half the angle of repose of α', placed on a moving belt 102 having raised lips 104 and a stopper 106. The lateral extent of the pile of feedstock 108" having the lower angle of repose α" would be quite large, if not constrained by the raised lips 104.

The angle of repose concept extends to the use of a belt with the raised lips at the sides, as well as a belt with a channel or groove formed on its top surface. These features provide a positive limit to the lateral extent of the pile of feedstock at the exit of the hopper. This serves to modify the cross section of the pile to that shown in FIG. 6. The area of this pile is described by:

$$(L_2H_2)-\{(\tan \alpha)(L_1L_2)^2\}$$

Figure 11:
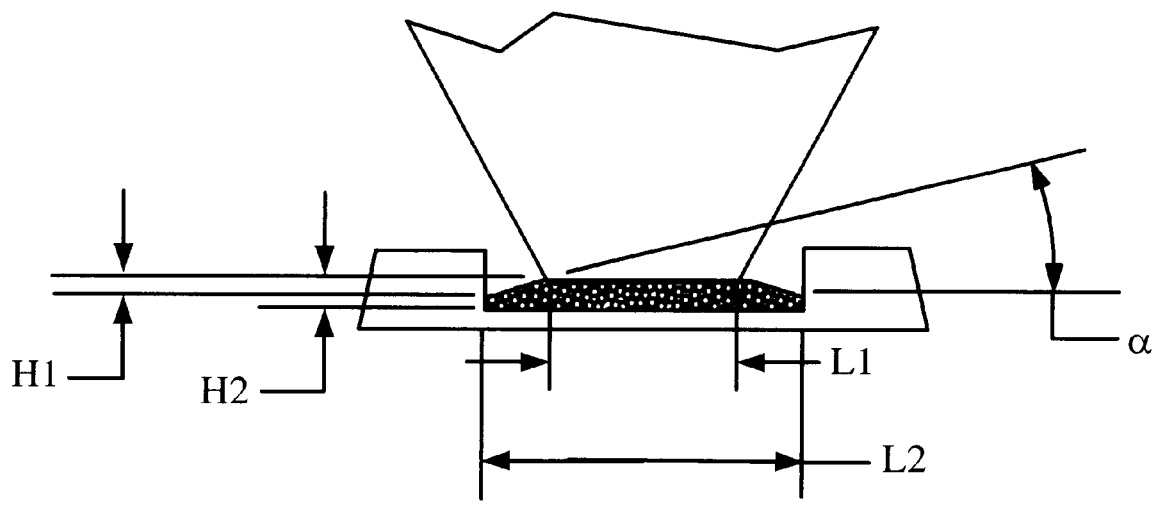
FIG. 11 illustrates the calculation of the cross sectional mass area of a pile of granular material on a belt of the crystal growth system of FIGS. 9a and 9b.

This calculation is illustrated in FIG. 11. The advantage here is that the overall width ($L_2$) of the pile can now be arbitrarily specified, where with the flat belt, this width depends on the angle of repose of the feedstock material.

In the present invention, the rate of introducing the source material can be controlled by adjusting the belt speed and is based on the angle of repose of the source material. This feature allows controllable and continuous replenishment of the melt, which in turn allows uniform, continuous crystal growth. Although the present invention has been illustrated with reference to a continuous ribbon crystal growth method and system, the invention is applicable to any crystalline growth system in which controlled replenishment of the feedstock material is desirable. For example, the present invention can be used with Czochralski crystal growth, Edge-Defined Film Growth (EFG dendritic web growth (WEB), or with solvent-metal assisted liquid phase growth systems.

Equivalents

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A method of continuous crystalline ribbon growth comprising the steps of:
   a) introducing a granular source material into a feeder;
   b) disposing a volume of the granular source material exiting the feeder on a translationally moving belt, the volume of the granular source material forming an angle of repose with the moving belt;
   c) continuously feeding the granular source material disposed on the moving belt into a crucible comprising a melt of the granular source material at a rate based on the angle of repose; and
   d) continuously growing a crystalline ribbon by solidifying the melt at a solid liquid interface.

2. The method of claim 1 wherein step a) comprises introducing a doped semiconductor source material into the feeder.

3. The method of claim 2 wherein the semiconductor source material comprises doped silicon.

4. The method of claim 1 wherein step a) comprises introducing a granular source material into a hopper.

5. The method of claim 4 wherein step c) comprises feeding the granular source material into the crucible at a rate based on the angle of repose, a rate of movement of the moving belt, and a size of an opening of the hopper.

6. The method of claim 5 wherein the rate of feeding the granular source material into the crucible and the rate of movement of the moving belt have a linear relationship.

7. The method of claim 1 wherein step b) comprises disposing a volume of the granular source material from a belt at a rate of from about 0.1 g/min to about 100 g/min.

8. The method of claim 1 wherein step b) comprises disposing a volume of the granular source material on a moving belt which is moving at a substantially constant rate.

9. The method of claim 1 wherein step c) comprises feeding the granular source material into the crucible at a constant rate.

10. The method of claim 1 further comprising the step of maintaining the depth of the melt at a constant level.

11. The method of claim 1 wherein step d) comprises forming the crystalline ribbon by solidifying the melt between a pair of strings passing through the crucible.

12. The method of claim 1 wherein step b) comprises disposing a volume of the granular source material on a translationally moving belt having at least one raised lip.

13. The method of claim 1 wherein step b) comprises disposing a volume of the granular source material on a translationally moving belt having a stopper positioned above the belt behind the feeder.

14. The method of claim 12 wherein step c) comprises continuously feeding the granular source material based on the angle of repose and a distance between a pair of lips.

15. A method of introducing a source material into a melt for use in a continuous crystalline growth comprising the steps of:
   a) introducing a granular source material into a hopper;
   b) disposing a volume of the granular source material exiting the hopper on a translationally moving belt having at least one raised lip disposed near an edge of the belt, the volume of the granular source material forming an angle of repose with the moving belt;
   c) continuously feeding the granular source material disposed on the moving belt in a crucible comprising a melt of the granular source material at a rate based on the angle of repose.

16. The method of claim 15 wherein step b) comprises disposing the volume of the granular source material on a translationally moving belt comprising a pair of raised lips, and step (c) comprises continuously feeding the granular source material at a rate based on the angle of repose and a distance between the pair of raised lips.

17. The method of claim 15 wherein step (c) comprises continuously feeding the granular source material at a rate based on a cross sectional area of the granular source material disposed on the moving belt.

18. The method of claim 15 wherein step (b) comprises disposing a volume of the granular source material on the moving belt comprising a stopper disposed above the belt behind the hopper.

* * * * *